United States Patent [19]

Watanabe et al.

[11] Patent Number: 5,330,352

[45] Date of Patent: Jul. 19, 1994

[54] OXIDATION/DIFFUSION PROCESSING APPARATUS

[75] Inventors: Shingo Watanabe, Tokyo; Shinichi Jintate, Hyogo, both of Japan

[73] Assignees: Tokyo Electron Sagami Limited, Kanagawa; Mitsubishi Electric Corporation, Tokyo, both of Japan

[21] Appl. No.: 11,372

[22] Filed: Jan. 29, 1993

[30] Foreign Application Priority Data

Jan. 31, 1992 [JP] Japan .................. 4-040747

[51] Int. Cl.$^5$ ............................................. F27B 9/04
[52] U.S. Cl. ................... 432/152; 432/205; 432/241; 432/253
[58] Field of Search .................. 432/5, 6, 152, 741, 432/253, 205

[56] References Cited

U.S. PATENT DOCUMENTS

| | | |
|---|---|---|
| 4,943,235 | 7/1990 | Nakao et al. ................. 432/241 |
| 4,950,870 | 8/1990 | Mitsuhashi et al. . | 
| 5,088,922 | 2/1992 | Kakizaki et al. . |
| 5,207,573 | 5/1993 | Miyagi et al. ................ 432/241 |
| 5,207,578 | 5/1993 | Sakata ......................... 432/241 |
| 5,226,812 | 7/1993 | Sakata ......................... 432/253 |

*Primary Examiner*—Henry C. Yuen
*Attorney, Agent, or Firm*—Oblon, Spivak, McClelland, Maier & Neustadt

[57] ABSTRACT

An oxidation/diffusion processing apparatus includes a processing vessel, arranged such that a longitudinal direction is vertical, for storing a plurality of target objects to be processed, a heater arranged around the processing vessel, for heating the interior of the processing vessel, a process gas supply mechanism for supplying a process gas from the lower portion of the processing vessel into the processing vessel, and an exhaust mechanism for exhausting a processed exhaust gas from the upper portion of the processing vessel. The process gas is supplied to the target objects heated to a predetermined temperature by the heater to perform oxidation/-diffusion processing to the target objects.

12 Claims, 3 Drawing Sheets

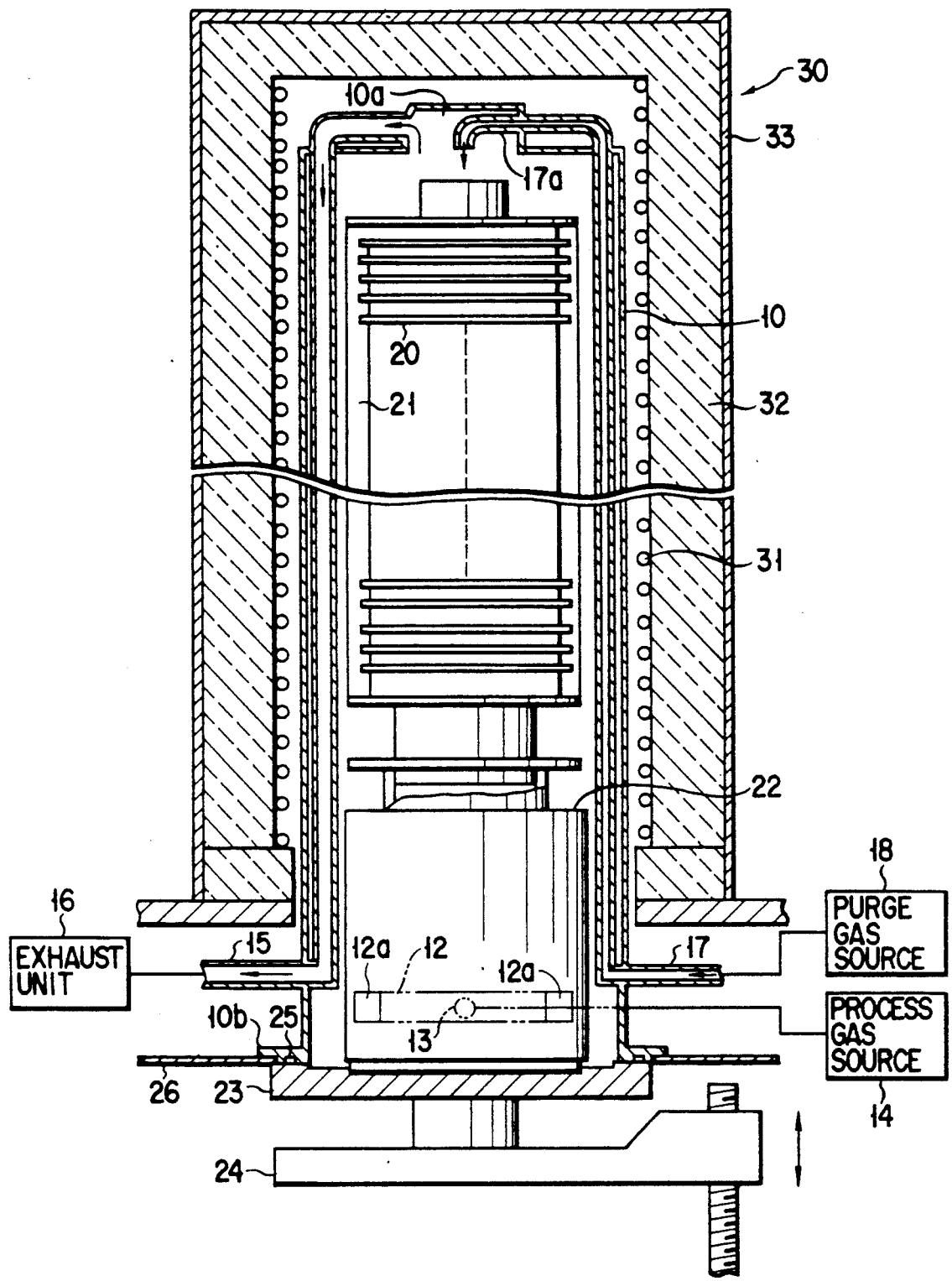
F I G. 1

OXIDATION/DIFFUSION PROCESSING APPARATUS

BACKGROUND OF THE INVENTION

1. Field of the Invention

The present invention relates to a vertical oxidation/diffusion processing apparatus.

2. Description of the Related Art

For example, in the manufacture of a semiconductor device, when oxidation/diffusion processing is to be performed to a semiconductor, a vertical oxidation/diffusion processing apparatus having a fused silica processing vessel is used. As the vertical oxidation/diffusion processing apparatus, a processing apparatus having a single tube structure processing vessel (U.S. Pat. No. 5,088.922) and a processing apparatus having a double tube structure processing vessel are conventionally used.

The processing apparatus in which a processing vessel has a single tube structure has the processing vessel of fused silica and a heater arranged around the processing vessel. A gas supply pipe is arranged inside or outside the processing vessel to extend from the lower portion to upper portion of the processing vessel, and a process gas is supplied from the upper portion of the processing vessel. The gas supply pipe is arranged to extend from the lower portion to upper portion of the processing vessel as described above because the process gas is heated to a predetermined temperature by the heater before the process gas is supplied into the processing vessel. When the process gas is heated in advance, desirable oxidation/diffusion processing can be performed. A gas exhaust pipe is arranged at the lower portion of the processing vessel. A wafer boat in which a large number of semiconductor wafers are arranged at predetermined intervals is mounted in the processing vessel, and predetermined oxidation/diffusion processing is performed to the semiconductor wafers.

When oxidation/diffusion processing is performed to the semiconductor wafers by the above apparatus, the temperature in the processing vessel is increased to a predetermined temperature (e.g., 1,000° C.) by the heater. while the semiconductor wafers are placed in the processing vessel, a process gas is supplied from the gas supply pipe. The process gas is heated to a predetermined temperature by a heater while the process gas rises in the gas supply pipe, and the heated process gas is supplied from the gas supply pipe into the processing vessel. The process gas supplied into the processing vessel flows from the upper portion to the lower portion of the processing vessel, and oxidation/diffusion processing is performed to the surfaces of the semiconductor wafers by the process gas. An exhaust gas is externally exhausted from the gas exhaust pipe.

On the other hand, in the processing apparatus in which a processing vessel has a double tube structure, the processing vessel is constituted by an inner tube and an outer tube, a gas supply pipe is arranged at the lower portion of the outer tube, and a gas exhaust pipe is arranged at the lower portion of the inner tube. A process gas supplied from the gas supply pipe rises between the inner tube and the outer tube and heated to a predetermined temperature, and oxidation/diffusion processing is performed to semiconductor wafers by the heated process gas.

However, in the conventional oxidation/diffusion processing apparatuses, the following inconvenience is posed.

When the processing vessel has the single or double tube structure, the process gas is supplied from the upper portion of the processing vessel, flows downward toward the lower portion, and is exhausted from the lower portion of the processing vessel. For this reason, the process gas resides due to the presence of the heat-insulating cylinder arranged at the lower portion of the processing vessel to support a wafer boat and insulate heat, the uniformity of oxidation/diffusion processing of a semiconductor wafer arranged on one side of the lower portion of the processing vessel is poor. In addition, since the gas exhaust pipe is arranged on only one side of the lower portion of the processing vessel, the flow of the process gas flowing downward in the processing vessel is offset on one side. For this reason, the oxidation/diffusion processing of the semiconductor wafer arranged on the lower portion side of the processing vessel is not uniformed.

When the processing vessel has the single tube structure, since a process gas having a relatively low temperature flows in the gas supply pipe, a temperature around the gas supply pipe becomes relatively low, and the temperature of a wafer surface is not uniformed. As a result, the thickness of an oxide film is not uniformed. When a gas supply pipe of fused silica is arranged outside the processing vessel of fused silica and is welded to the vessel, the gas supply pipe is easily damaged and cannot be easily handled at the time of maintenance such as cleaning of the processing vessel. When the processing vessel having the double tube structure is used, its structure is complicated, and the manufacture of the apparatus is cumbersome, thereby increasing the production cost of the apparatus.

SUMMARY OF THE INVENTION

It is the first object of the present invention to provide an oxidation/diffusion processing apparatus capable of uniformly performing oxidation/diffusion processing to a target object to be processed without any residence and nonuniform distribution of a process gas and any nonuniform distribution of a temperature in a processing vessel.

It is the second object of the present invention to provide an oxidation/diffusion processing apparatus having a structure which can be easily handled during cleaning or the like of a processing vessel.

It is the third object of the present invention to provide an oxidation/diffusion processing apparatus in which a processing vessel has no complicated structure and can be easily manufactured.

According to the present invention, first, there is provided an oxidation/diffusion processing apparatus comprising: a processing vessel, arranged such that a longitudinal direction thereof is vertical, for storing a plurality of target objects to be processed; heating means, arranged around the processing vessel, for heating an interior of the processing vessel; process gas supply means for supplying a process gas from a lower portion of the processing vessel into the processing vessel; and exhaust means for exhausting a processed exhaust gas from an upper portion of the processing vessel, wherein the process gas is supplied to the target objects heated to a predetermined temperature by the heating means to perform oxidation/diffusion processing to the target objects.

According to the present invention, second, there is provided an oxidation/diffusion processing apparatus comprising: a processing vessel, arranged perpendicularly to a longitudinal direction, for storing a plurality of target objects to be processed; heating means, arranged around the processing vessel, for heating an interior of the processing vessel; process gas supply means for supplying a process gas from a lower portion of the processing vessel into the processing vessel; exhaust means for exhausting a processed exhaust gas from an upper portion of the processing vessel; and purge gas supply means for supplying a purge gas from the upper portion of the processing vessel into the processing vessel, wherein the process gas is supplied to the target objects heated to a predetermined temperature by the heating means to perform oxidation/diffusion processing to the target objects, and a gas in the processing vessel is purged by the purge gas supply means when the target objects are loaded and unloaded.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing an oxidation/diffusion processing apparatus according to an embodiment of the present invention;

DETAILED DESCRIPTION OF THE PREFERRED EMBODIMENTS

In a conventional oxidation/diffusion processing apparatus, in order to increase the temperature of a process gas to effectively perform oxidation/diffusion processing of target objects, the process gas is supplied from the upper portion of a processing vessel. However, the following finding is obtained from the result of the extensive studies made by the present inventors. That is, even when the process gas is supplied from the lower portion of the processing vessel, the temperature of the process gas is sufficiently increased until the process gas reaches a target object to be processed. It is also found that the above-described conventional inconvenience can be solved when the process gas is supplied from the lower portion of the processing vessel and exhausted from the upper portion of the processing vessel. The present invention is based on the above findings of the present inventors.

A preferable embodiment of the present invention will be described below in detail with reference to the accompanying drawings.

FIG. 1 is a sectional view showing an oxidation/diffusion processing apparatus according to an embodiment of the present invention. As shown in FIG. 1, the oxidation/diffusion processing apparatus has a processing vessel 10 for storing target objects to be subjected to oxidation/diffusion processing, e.g., semiconductor wafers. The processing vessel 10 has the shape of a cylinder whose upper portion is closed and lower end is open, and the processing vessel 10 is arranged such that the longitudinal direction thereof is vertical. The processing vessel 10 is formed of a heat-resistant material such as high-purity fused silica ($SiO_2$). A projection portion 10a is formed at the central portion of the upper end portion of the processing vessel 10, and a collar portion 10b is formed at the lower end of the processing vessel 10.

Figure 2:
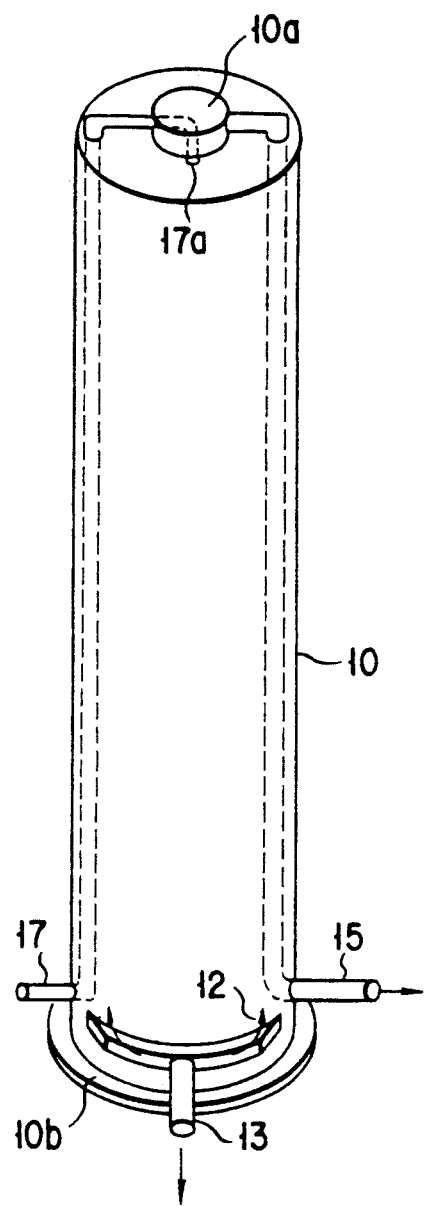
FIG. 2 is a perspective view showing a processing vessel used in the apparatus in FIG. 1.
Figure 3:
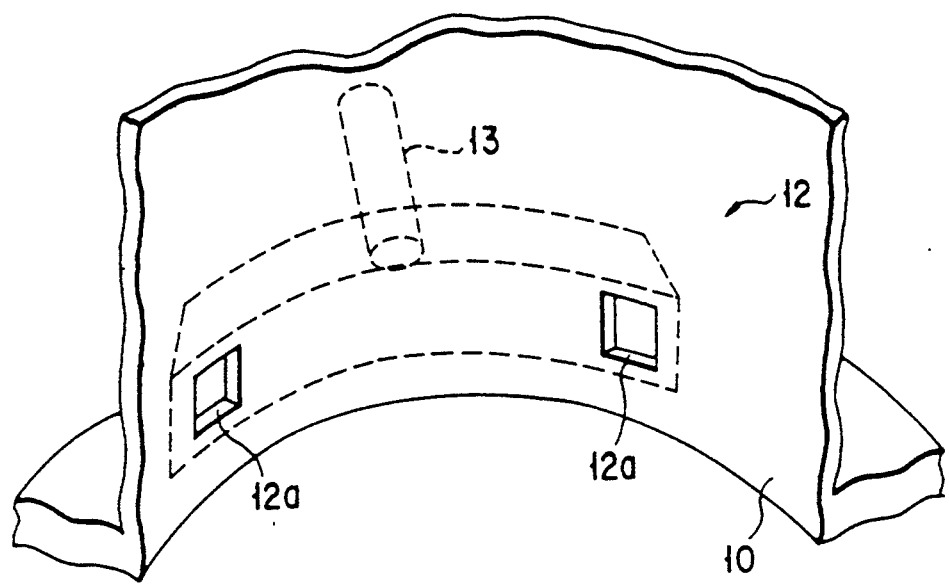
FIG. 3 is a perspective view showing a process gas supply portion used in the apparatus in FIG. 1.

A process gas supply portion 12 for supplying a process gas into the processing vessel is arranged at the lower portion of the processing vessel 10. The process gas supply portion 12, as shown in FIG. 2, is arranged to be connected to the side wall of the processing vessel 10, and two gas supply holes 12a for supplying the process gas into the processing vessel 10 are formed in the process gas supply portion 12 as shown in FIG. 3. A process gas supply pipe 13 is connected to the process gas supply portion 12, and the process gas supply pipe 13 is connected to a process gas source 14 through a pipe (not shown). The process gas from the process gas source 14 is supplied from the gas supply holes 12a into the processing vessel 10 through the process gas supply pipe 13 and the process gas supply portion 12. In this case, the two gas supply holes 12a, for example, are formed symmetrically about the process gas supply pipe 13.

A gas exhaust pipe 15 has the inlet port end portion connected to the projection portion 10a of the processing vessel 10. The intermediate portion of the gas exhaust pipe 15 is arranged in the processing vessel 10 and extends downward in the processing vessel 10, and the outlet port end portion of the gas exhaust pipe 15 projects outside the processing vessel 10 from the lower portion of the processing vessel 10. The outlet port end portion of the gas exhaust pipe 15 is connected to an exhaust unit 16 through a pipe (not shown).

A purge gas supply pipe 17 is connected to the processing vessel 10 at the lower portion of the side wall of the processing vessel 10, extends upward in the processing vessel 10 and projects outside the processing vessel 10. An outlet port end portion 17a of the purge gas supply pipe 17 is inserted into the processing vessel 10 from the projection portion 10a of the processing vessel 10. The outlet end of the purge gas supply pipe 17 is positioned at the center of the upper portion of the processing vessel 10. The inlet port end portion of the purge gas supply pipe 17 is connected to a purge gas source 18 through a pipe (not shown). When a semiconductor wafer is loaded and unloaded, a purge gas such as nitrogen gas ($N_2$) or argon gas (At) is supplied from the purge gas source 18 into the processing vessel 10 to prevent atmospheric air from flowing into the processing vessel 10.

The process gas supply portion 12, the process gas supply pipe 13, the gas exhaust pipe 15, and the purge gas supply pipe 17 consist of a heat-resistant material, e.g., high-purity fused silica ($SiO_2$), like the processing vessel 10. These members preferably formed of the same material as that of the processing vessel 10 and integrated with the processing vessel 10. The members may be formed independently of the processing vessel 10 and formed of another material, e.g., SiC. In this case, the members can be hermetically fixed to the processing vessel 10 such that the members are weld to the processing vessel 10.

A predetermined number (e.g., 150) of semiconductor wafers 20 to be processed are parallelly arranged on a wafer boat 21 at predetermined intervals, and the wafer boat 21 is stored in the processing vessel 10. The wafer boat 21 is arranged on a heat-insulating cylinder 22, and the heat-insulating cylinder 22 is supported by a lid member 23. The lid member 23, the heat-insulating cylinder 22, and the wafer boat 21 are mounted on a lifting mechanism 24, and these members are movable vertically by the lifting mechanism 24. The semiconductor wafers 20 can be loaded or unloaded in the processing vessel 10 by the vertical movement of the lifting mechanism 24. When the semiconductor wafers 20 are loaded, the lid member 23 is brought into tight contact with the collar portion 10b of the processing vessel 10, and the processing vessel 10 is hermetically sealed. In order assure the above hermetic state, an O-ring seal 25 is inserted between the lid member 23 and the collar portion 10b.

A heater unit 30 is arranged outside the processing vessel 10 to surround the processing vessel 10. The heater unit 30 is constituted by a heater 31, a heat insulator 32, and an outer cover 33, and the heater 31 has a spiral shape and is arranged inside the heat insulator 32. A power supply (not shown) is connected to the heater 31. When the power supply supplies a power to the heater 31, the heater 31 generates heat, and the temperature in the processing vessel 10 is increased to a predetermined temperature, e.g., 1,000° C.

The processing vessel 10 is supported by a support board 26 outside the collar portion 10b.

The practical dimensions of the above oxidation/diffusion processing apparatus for, e.g., an 8-inch disk are as follows. That is, the inner diameter of the processing vessel 10 is 285 mm, the inner and outer diameters of the gas exhaust pipe 15 are 12 mm and 16 mm, respectively, the inner and outer diameters of the purge gas supply pipe 17 are 7 mm and 10 mm, respectively and the outer diameter of heat-insulating cylinder 22 is 240 mm. A distance between the process gas supply pipe 13 and the lower end of the wafer boat 21 is about 350 to 400 min.

The sectional area of a gas pass formed between the vessel 10 and the heat-insulating cylinder 22 is $$\left\{ \left(\frac{285}{2}\right)^2 - \left(\frac{240}{2}\right)^2 \right\} \times \pi = 18555 \text{ mm}^2.$$

The sectional area of a gas pass portion of the gas exhaust pipe 15 is $$\left(\frac{12}{2}\right)^2 \times \pi = 133 \text{ mm}^2$$

That is, the ratio of the former to the latter is about 140. Since the flow rate of the process gas is substantially in inverse proportion to the sectional area of the gas pass, the process gas is sufficiently preheated between the processing vessel 10 and the heat-insulating cylinder 22.

When processing is to be actually performed by the oxidation/diffusion processing apparatus, while the lifting mechanism 24 is in the state of moved downward, the wafer boat 21 on which the semiconductor wafers 20 are mounted is mounted on the heat-insulating cylinder 22. The wafer boat 21 is moved upward by the lifting mechanism 24, and the semiconductor wafer 20 is loaded in the processing vessel 10.

In this state, a power is supplied to the heater 31 of the heater unit 30, and the temperature in the processing vessel 10 is set to be a predetermined temperature, e.g., 1,000° C., required for oxidation/diffusion processing. A process gas ( e.g., H$_2$O (steam) ) is supplied from the gas supply holes 12a into the processing vessel 10 through the process gas supply pipe 13 and the process gas supply portion 12, thereby performing oxidation/diffusion processing at the atmospheric pressure. During this processing, an exhaust gas is exhausted from the gas exhaust pipe 15.

In this case, if the temperature of a semiconductor wafer inserted portion in the processing vessel 10 is 1,000° C., the temperature of almost whole portion of the heat-insulating cylinder 22 in the lower portion of the vessel 10 has been increased to about 700° C. Therefore, the process gas supplied from the lower portion of the processing vessel 10 is sufficiently preheated until the process gas reaches the semiconductor wafers.

After the processing is finished, a purge gas is supplied from the purge gas supply pipe 17 into the processing vessel 10 to completely substitute the gas in the processing vessel 10 with the purge gas. Thereafter, the lifting mechanism 24 is moved downward, and the semiconductor wafers 20 are unloaded.

According to the above oxidation/diffusion processing apparatus, the following effects can be obtained.

(1) The gas exhaust pipe 15 is arranged on the upper portion of the processing vessel 10, and no obstacle which causes a process gas to reside is arranged on the upper portion. For this reason, the process gas supplied from the lower portion of the processing vessel 10 is smoothly exhausted without residing at the upper portion of the processing vessel 10, and uniform processing can be performed.

(2) Since the two gas supply holes 12a are formed in the process gas supply portion 12 to be separated from each other, a process gas from the single process gas supply pipe 13 can be uniformly supplied into the processing vessel 10.

(3) Since the inlet port end portion of the gas exhaust pipe 15 is positioned at the center of the upper portion of the processing vessel 10, a process gas can be uniformly exhausted.

(4) A process gas is supplied from the lower portion of the processing vessel 10. In this case, since the process gas is sufficiently heated in advance in the lower space of the processing vessel 10, unlike the prior art, a processing vessel 1 need not have a double tube structure to preheat a process gas, and the gas supply pipe need not extend to the upper portion of the processing vessel. Therefore, the apparatus can be easily manufactured.

(5) Since a process gas is sufficiently heated in advance in the lower space of the processing vessel 10, even when a flow rate of the process gas is increased, oxidation/diffusion processing can be preferably performed, and an apparatus suitable for performing oxidation/diffusion processing to a large number of semiconductor wafers can be obtained.

(6) Since a process gas need not be supplied into the processing vessel 10 after the process gas is moved upward to the upper portion of the processing vessel 10, the nonuniformity of the thickness in each wafer surface caused by a decrease in temperature by the process gas can be prevented.

(7) Since the intermediate portions of the gas exhaust pipe 15 and the purge gas supply pipe 17 are arranged in the processing vessel 10, the processing vessel 10 can be easily handled when the processing vessel 10 is cleaned, and the gas exhaust pipe 15 and the purge gas supply pipe 17 will not be damaged.

Since the purge gas is supplied into the processing vessel 10 from upper end portion of the vessel 10 through the purge gas supply pipe 17, when the target object to be processed is loaded or unloaded, interior of the processing vessel 10 can be in uniform purge gas atmosphere.

In the processing at the atmospheric pressure, the diameters of the gas supply pipe and the exhaust pipe can be small, i.e., 5 to 20 mm, and the space for the apparatus can be saved.

The following test was performed. That is, the oxidation/diffusion processing apparatus shown in FIG. 1 was used, 100 semiconductor wafers were parallelly arranged on the wafer boat 21, and a thermal oxide film having an average thickness of 200 Å was formed on the surface of each of the semiconductor wafers. As a result, a variation in thickness of the thermal oxide film on each of the semiconductor wafers fell within the range of ±2%, and the uniformity of the thickness of the thermal oxide film was excellent.

Figure 4:
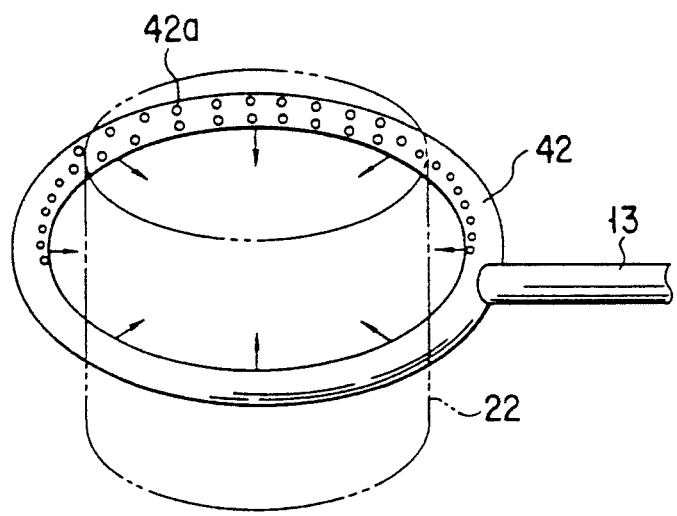
FIG. 4 is a perspective view showing a modification of the process gas supply portion in FIG. 3.

When a test as in the above-described test was performed using a conventional oxidation/diffusion processing apparatus having a single tube processing vessel, a variation in thickness of the thermal oxide film on each of the semiconductor wafers fell within the range of ±4%, and the uniformity of the thickness of the thermal oxide film was poor. In addition, a difference between the thickness of a thermal oxide film formed on the semiconductor wafer positioned at the highest portion of the wafer boat and the thickness of a thermal oxide film formed on the semiconductor wafer positioned at the lowest portion of the wafer boat was measured to be 200 Å ±6 Å, and the uniformity of the thicknesses was degraded. 5 Although a case wherein the two gas supply holes 12a of the process gas supply portion 12 are formed is exemplified in the above embodiment, the present invention is not limited to this. Three or more gas supply holes may be formed, thereby further improving the uniformity of gas supply. For example, as shown in FIG. 4, a ring-like gas supply portion 42 may be arranged over the entire peripheral surface of the heat-insulating cylinder 22, and a large number of gas supply holes 42 a may be uniformly formed in the entire peripheral surface of the gas supply portion 42. In addition, the shape of each of the gas supply holes is not limited to a square shown in FIG. 3, and can be variously changed.

The processing at the atmospheric pressure has been described in the above embodiment. However, the oxidation/diffusion processing apparatus of the present invention can be applied to not only the processing at the atmospheric pressure but low-pressure processing and vacuum processing.

The oxidation/diffusion processing in the present invention means oxidation/diffusion processing in a wide sense. The oxidation/diffusion processing includes, in addition to oxidation processing and diffusion processing in a narrow sense, various heat-treatments such as annealing and sintering.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An oxidation/diffusion processing apparatus, comprising:

a processing vessel, arranged such that a longitudinal direction thereof is vertical, for storing a plurality of target objects to be processed;

heating means, arranged around said processing vessel, for heating an interior of said processing vessel;

process gas supply means for supplying a process gas from a lower portion of said processing vessel into said processing vessel, said process gas supply means comprising a process gas supply source and a process gas inlet pipe communicating with both said process gas supply source and a lower portion of said processing vessel; and exhaust means for exhausting an exhaust gas of process gas from an upper portion of said processing vessel, said exhaust means comprising a gas discharge pipe and an exhaust unit connected to said gas discharge pipe, said gas discharge pipe being open in a central portion inside the processing vessel at an upper end portion of the processing vessel and having a part extending upward within the processing vessel;

wherein the process gas is supplied to said target objected heated to a predetermined temperature by said heating means to perform oxidation/diffusion processing to said target objects.

2. An apparatus according to claim 1, wherein said process gas supply means further comprises a process gas supply portion, having a plurality of supply holes, for supplying the process gas from said process gas inlet pipe into said processing vessel.

3. An apparatus according to claim 1, wherein said process gas inlet pipe is integrated with said processing vessel.

4. An apparatus according to claim 1, wherein said gas discharge pipe is integrated with said processing vessel.

5. An apparatus according to claim 4, wherein said gas discharge pipe and said process gas supply pipe are integrated with said processing vessel.

6. An apparatus according to claim 1, wherein said gas discharge pipe has an intermediate portion extending from the upper portion to the lower portion of said processing vessel, and the intermediate portion is arranged in said processing vessel.

7. An apparatus according to claim 1, wherein said oxidation/diffusion processing apparatus is used for processing at an atmospheric pressure.

8. An oxidation/diffusion processing apparatus, comprising:

a processing vessel, arranged such that a longitudinal direction thereof is vertical, for storing a plurality of target objects to be processed;

heating means, arranged around said processing vessel, for heating an interior of said processing vessel;

process gas supply means for supplying a process gas from a lower portion of said processing vessel into said processing vessel, said process gas supply means comprising a process gas supply source and a process gas inlet pipe communicating with both said process gas supply source and a lower portion of said processing vessel;

exhaust means for exhausting an exhaust gas of process gas from an upper portion of said processing vessel, said exhaust means comprising a gas discharge pipe and an exhaust unit connected to said gas discharge pipe, said gas discharge pipe being open in a central portion inside the processing vessel at an upper end portion of the processing vessel and having a part extending upward within the processing vessel; and purge gas supply means for supplying a purge gas from an upper portion of said processing vessel into said processing vessel;

wherein the process gas is supplied to said target objects heated to a predetermined temperature by said heating means to perform oxidation/diffusion processing to said target objects, and a gas in said processing vessel is purged by said purge gas supply means when said target objects are loaded and unloaded.

9. An apparatus according to claim 8, wherein said process gas supply means further comprises a process gas supply portion, having a plurality of supply holes, for supplying the process gas from said process gas inlet pipe into said processing vessel.

10. An apparatus according to claim 8, wherein said purge gas supply pipe is inserted in said processing vessel at the lower portion of said processing vessel, so that a portion of said purge gas supply pipe extending from an inserted portion to a portion corresponding to the upper portion of said processing vessel is arranged in said processing vessel.

11. An apparatus according to claim 8, wherein a gas inlet port end of said purge gas supply pipe is positioned at a central portion of the upper portion of said processing vessel.

12. An apparatus according to claim 8, wherein said gas discharge pipe, said process gas inlet pipe, and said purge gas supply pipe are integrated with said processing vessel.

* * * * *